(12) United States Patent
Song et al.

(10) Patent No.: US 7,429,520 B2
(45) Date of Patent: Sep. 30, 2008

(54) METHODS FOR FORMING TRENCH ISOLATION

(75) Inventors: Pil Geun Song, Seoul (KR); Young Jun Kim, Seoul (KR); Sang Wook Park, Seoul (KR)

(73) Assignee: Hynix Semiconductor Inc., Icheon-shi (KR)

( * ) Notice: Subject to any disclaimer, the term of this patent is extended or adjusted under 35 U.S.C. 154(b) by 268 days.

(21) Appl. No.: 11/156,998

(22) Filed: Jun. 20, 2005

(65) Prior Publication Data

US 2006/0205173 A1   Sep. 14, 2006

(30) Foreign Application Priority Data

Mar. 9, 2005 (KR) .................... 10-2005-0019636

(51) Int. Cl.
*H01L 21/76* (2006.01)

(52) U.S. Cl. ............ 438/435; 438/424; 257/E21.546

(58) Field of Classification Search ........... 438/400, 438/424, 435; 257/E21.546
See application file for complete search history.

(56) References Cited

U.S. PATENT DOCUMENTS

| | | | |
|---|---|---|---|
| 6,245,642 B1 * | 6/2001 | Satoh | ........... 438/427 |
| 6,461,937 B1 | 10/2002 | Kim et al. | |
| 2001/0015046 A1 * | 8/2001 | Hong | ........... 52/741.11 |
| 2003/0042539 A1 * | 3/2003 | Lee et al. | ........... 257/330 |
| 2006/0183296 A1 * | 8/2006 | Yoo et al. | ........... 438/424 |

FOREIGN PATENT DOCUMENTS

| | | |
|---|---|---|
| JP | 2004-288965 | 10/2004 |
| KR | 2004-0004990 | 1/2004 |
| KR | 2005-0012652 | 2/2005 |

OTHER PUBLICATIONS

Official action issued by the China State Intellectual Property Office in counterpart Chinese patent application 2005/10091052.5 filed Aug. 4, 2005.
Taiwanese offical action dated Apr. 10, 2008, in corresponding Taiwanese application No. 94120981 (and English-language translation thereof).

* cited by examiner

*Primary Examiner*—Bradley K Smith
(74) *Attorney, Agent, or Firm*—Marshall, Gerstein & Borun LLP

(57) ABSTRACT

A method of forming an isolation film in a semiconductor device is disclosed. The disclosed method includes performing a patterning process on a predetermined region of a semiconductor substrate in which a patterned pad film is formed, forming a trench defining an inactive region and an active region, forming a liner film on the entire surface including the trench, forming an insulating film for trench burial only within the trench, stripping the remaining liner film formed except for the inside of the trench and the patterned pad film formed below the liner film, forming a sacrificial film on the entire surface, and performing a polishing process on the entire surface in which the sacrificial film is formed until the semiconductor substrate of the active region is exposed, thereby forming the isolation film having no topology difference with the semiconductor substrate of the active region.

9 Claims, 2 Drawing Sheets

METHODS FOR FORMING TRENCH ISOLATION

BACKGROUND

1. Technical Field

Methods for isolation films of semiconductor devices are shown and described.

2. Disclosure of the Related Art

As semiconductor devices become more highly-integrated, semiconductor manufacturing processes become more complicated. Further, there is an urgent need for the development of isolation film technology having good electrical properties at a small area.

Technologies for fabricating isolation films include a shallow trench isolation method. A pad oxide film and a pad nitride film are first sequentially formed on a semiconductor substrate. An isolation mask is then formed on the pad oxide film. If the pad nitride film, the pad oxide film and the semiconductor substrate of a predetermined thickness are etched by means of the etch process using the isolation mask, trenches are formed in the semiconductor substrate. An insulating film for trench burial is formed to bury the trenches, and the top surface of the insulating film is then polished. The pad nitride film and the pad oxide film are then removed.

At this time, a moat is unintentionally created in which the oxide film is located at the interface between the oxide film burying the trenches and the semiconductor substrate, i.e., the interface between an inactive region and an active region of the isolation region is etched into the trenches. This makes a subsequent process difficult and causes the leakage current of the semiconductor substrate.

Accordingly, there is a need for technology that can improve threshold voltage characteristics of cells by avoiding the above-described moat phenomenon that can be generated at the interface between an inactive region and an active region, and that can enhance the reliability of semiconductor devices by securing characteristics of a stabilized transistor.

SUMMARY OF THE DISCLOSURE

Accordingly, in view of the above problems, a method of forming an isolation film of a semiconductor device is disclosed, wherein threshold voltage characteristics of cells can be improved by prohibiting the moat phenomenon that can be generated at the interface between an inactive region and an active region, and wherein the reliability of the resulting semiconductor devices can be improved through secured characteristics of a stabilized transistor by improving threshold voltage characteristics of cells.

A disclosed method of forming an isolation film comprises: performing a patterning process on a predetermined region of a semiconductor substrate in which a patterned pad film is formed; forming a trench defining an inactive region and an active region; forming a liner film on the entire surface including the trench; forming an insulating film for trench burial only within the trench; stripping the remaining liner film formed except for the inside of the trench and the patterned pad film formed below the liner film, forming a sacrificial film on the entire surface; and performing a polishing process on the entire surface in which the sacrificial film is formed until the semiconductor substrate of the active region is exposed, thereby forming the isolation film with little or no topology difference with the semiconductor substrate of the active region.

The pad film may be a pad nitride film.

The pad film preferably has a pad oxide film and a pad nitride film sequentially formed on.

The disclosed method can further comprise forming a wall oxide film on sidewalls of the trench, after the trench is formed.

The liner film is preferably a nitride liner film.

The forming the insulating film for trench burial only within the trench may include forming the insulating film for trench burial on the entire surface of the semiconductor substrate in which the liner film is formed, and then performing a polishing process until the pad film is exposed.

The stripping of the remaining liner film formed except for the inside of the trench and the patterned pad film may include stripping the liner film formed on the sidewalls of the trench to a predetermined depth, while stripping the liner film and the pad film, whereby moats are formed at the interface between the inactive region and the active region.

The sacrificial film is preferably formed while filling the moats formed at the interface between the inactive region and the active region.

The sacrificial film can be formed using a sacrificial oxide film that is formed by means of a deposition method of the CVD mode or PVD mode, or a sacrificial oxide film that is formed by means of a growth process of an oxygen atmosphere.

The sacrificial oxide film may be formed by means of a dry oxidization process or a wet oxidization process using $H_2$ and $O_2$ gas at a pressure of about 10 to 100 Torr for about 3 to 5 hours.

The polishing process may be performed using one of a dry etch process, a CMP process and a wet etch process.

The dry etch process may be performed using a gas having a high selective ratio between the sacrificial film and the insulating film for trench burial.

The dry etch process may be performed using a mixed gas of $CH_3$ gas and $CF_4$ gas at high bias power of 200 W.

The CMP process may be performed using slurry having a high selective ratio between the sacrificial film and the insulating film for trench burial.

A method of forming an isolation film of a semiconductor device comprises: the steps of providing a semiconductor substrate in which moats are formed at the interface between an active region and an inactive region; forming an isolation film buried with an insulating film for trench burial in the inactive region; forming a sacrificial film on the entire surface; and performing a polishing process on the entire surface in which the sacrificial film is formed until the semiconductor substrate of the active region is exposed, thereby forming the isolation film having no topology difference with the semiconductor substrate of the active region.

The sacrificial film may be formed using a sacrificial oxide film that is formed by means of a deposition method of the CVD mode or PVD mode, or a sacrificial oxide film that is formed by means of a growth process of an oxygen atmosphere.

The sacrificial oxide film may be formed by means of a dry oxidization process or a wet oxidization process using $H_2$ and $O_2$ gas at a pressure in the range of from about 10 to about 100 Torr for a time period in the range of from about 3 to about 5 hours.

The polishing process may be performed using one of a dry etch process, a CMP process and a wet etch process.

The dry etch process may be performed using a gas having a high selective ratio between the sacrificial film and the insulating film for trench burial.

The dry etch process may be performed using a mixed gas of $CH_3$ gas and $CF_4$ gas at high bias power of about 200 W.

The CMP process may be performed using slurry having a high selective ratio between the sacrificial film and the insulating film for trench burial.

DETAILED DESCRIPTION OF THE PRESENTLY PREFERRED EMBODIMENTS

Figure 1:
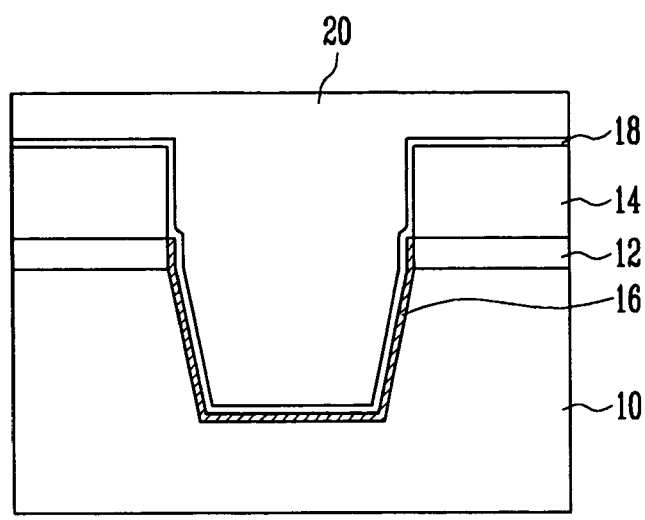
FIGS. 1 to 6 are cross-sectional views explaining a disclosed method of forming an isolation film of a semiconductor device.

In the description below, when one film is described as being "disposed on" or "on" another film or a semiconductor substrate, the one film may directly contact the other film or the semiconductor substrate or, one or more additional films may be disposed between the one film and the other film or the semiconductor substrate. Furthermore, in the drawings, the thickness and size of each layer is not to scale and may be exaggerated for convenience of explanation and clarity. Like reference numerals are used to identify the same or similar parts.

FIGS. 1 to 6 are cross-sectional views for explaining a disclosed method of forming an isolation film of a semiconductor device. Referring to FIG. 1, a pad oxide film 12 and a pad nitride film 14 are sequentially formed on a semiconductor substrate 10. A patterning process for defining an active region and an inactive region is then performed on the semiconductor substrate 10 on which the pad nitride film 14 is formed, thereby forming a trench in which a predetermined region of the semiconductor substrate is etched.

A thermal oxidization process is then performed on the resulting structure in which the trench is formed, thus forming a wall oxide film 16 on sidewalls of the trench. A nitride liner film 18 is then formed to a predetermined thickness along the sidewalls on which the wall oxide film 16 is formed.

In order to fill the trench in which the wall oxide film 16 and the nitride liner film 18 are stacked, an insulating film 20 is deposited which is a HDP oxide film having good gap-fill characteristics and which is enough to cover the entire semiconductor substrate, is formed.

Figure 2:
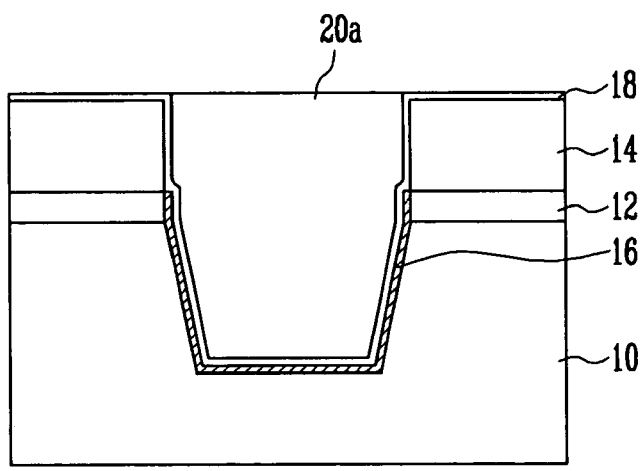

Referring to FIG. 2, a polishing process, such as a CMP process, is performed on the entire result in which the insulating film 20 for trench burial is formed until the nitride liner film 18 is exposed, thereby forming an isolation film 20a. During the polishing process, the nitride liner film formed on the pad nitride film 14 serves as anti-polishing layer.

Figure 3:
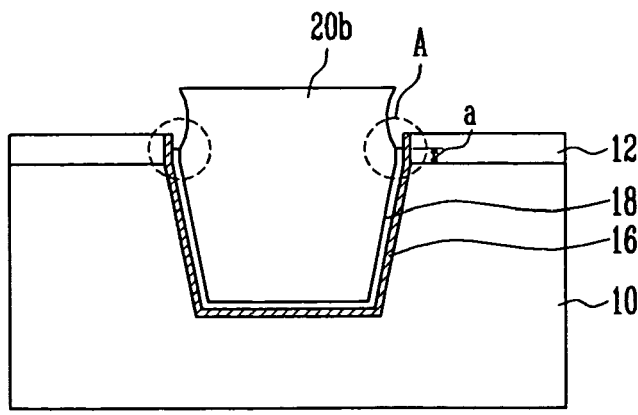

Referring to FIG. 3, if an etch process for stripping the nitride liner film 18, and the pad nitride film 14 is performed, an isolation film 20b in which the sidewalls of the trench are recessed to a predetermined thickness is formed. In the etch process for stripping the nitride liner film 18 and the pad nitride film 14, the nitride liner film 18 remaining on the sidewalls of the trench is etched to a predetermined depth while the sidewalls of the HDP oxide film 20 is recessed to a predetermined thickness, due to a difference in the etch selective ratio between the nitride line film 18 and the HDP oxide film 20a being an insulating film for trench burial, which is adjacent to the nitride liner film 18. As a result, moats ("A" in FIG. 3) are generated at the interface between an inactive region and an active region in which the isolation film is formed.

Figure 4:
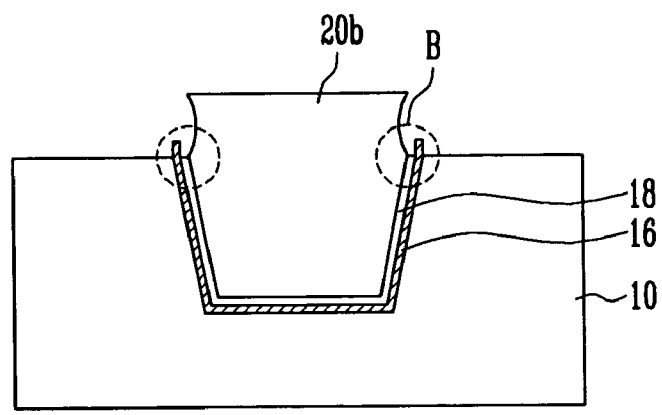

Referring to FIG. 4, if an etch process for removing the pad oxide film 12 formed below the pad nitride film 14 is performed, the semiconductor substrate of the active region is exposed. At the time of the process for stripping the pad oxide film 12, the nitride liner film 18 that is etched to a predetermined depth shown in FIG. 3 is further etched whereby the moats at the interface between the inactive region and the active region ("B" in FIG. 4) become deeper. That is, although the moat A whose height above the semiconductor substrate 10 is about "a" as shown in FIG. 3, the moat B having a similar height as that of the semiconductor substrate 10 of FIG. 4 is formed.

Figure 5:
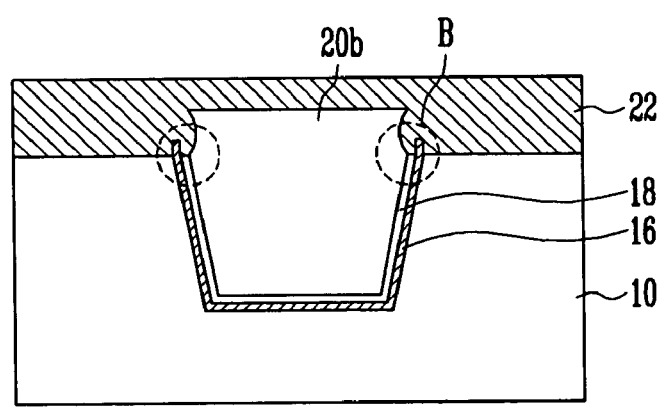

Referring to FIG. 5, a sacrificial oxide film 22, preferably a $SiO_2$ film is formed on the entire surface from which the pad oxide film 12 has been stripped, the film 22 will be used as a sacrificial film in a polishing process that will be performed subsequently. The sacrificial oxide film 22 can be formed by means of a deposition method of the CVD mode or the PVD mode, or can be formed by growing it on the semiconductor substrate 10 exposed by stripping the pad oxide film and the oxide film of the isolation film by means of a growth process of an oxygen atmosphere.

The oxide film growth process under the oxygen atmosphere can be performed using a dry oxidization process or a wet oxidization process using $H_2$ and $O_2$ gas at a pressure of about 10 to 100 Torr for about 3 to 5 hours. The sacrificial oxide film 22 is formed to a thickness greater than that of the isolation film 20b, while filling the moats ("B" in FIG. 4) at the interface between the inactive region and the active region, which are generated due to the nitride liner film 18 etched to a predetermined depth.

Figure 6:
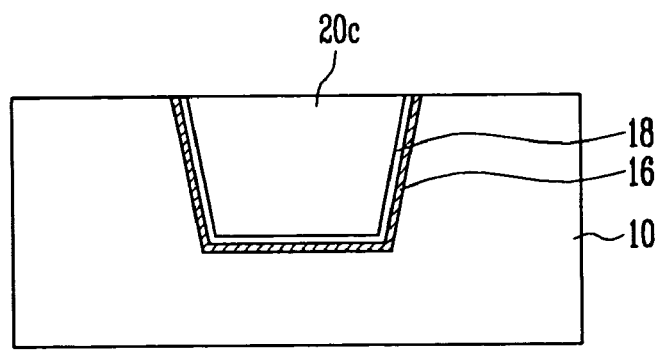

Referring to FIG. 6, if a polishing process is performed on the entire surface in which the sacrificial oxide film 22 is formed until the semiconductor substrate 10 of the active region is exposed, an isolation film 20c having the same height as that of the active region is formed.

After the polishing process is performed, the sacrificial oxide film 22 is stripped. Thus, the height 20c of the isolation film of the inactive region becomes the same as that of semiconductor substrate 10 of the active region, while the semiconductor substrate of the active region is exposed.

The polishing process can be performs using one of a dry etch process, a CMP process and a wet etch process.

The dry etch process for performing polishing can be performed in process conditions in which a mixed gas of $CH_3$ gas and $CF_4$ gas having a high selectivity ratio between the sacrificial oxide film 22 being $SiO_2$ and the isolation film 20b being a HDP oxide film is used, and high bias power is 200 W or higher.

Furthermore, the CMP process for performing polishing can be performed using a slurry having a high selectivity ratio between the sacrificial oxide film 22 being $SiO_2$ and the isolation film 20b being a HDP oxide film.

As described above, after moats formed at the interface between an active region and an inactive region are filled with a sacrificial oxide film, the remaining sacrificial oxide film except for the sacrificial oxide film fills in the moats is stripped by means of a polishing process. As such, since a moat phenomenon that can be generated at the interface between the inactive region and the active region is avoided, threshold voltage characteristics of a cell can be improved. If the threshold voltage characteristics of a cell is improved, there are effects in that characteristics of a stabilized transistor is secured and the reliability of a semiconductor device is increased.

Furthermore, since moats formed at the interface between an active region and an inactive region are filled with a sacrificial oxide film, there is an effect in that bridge failure due to the remnants generated in a subsequent process is prevented.

Although the foregoing description has been made with reference to the preferred embodiments, it is to be understood that changes and modifications may be made by the ordinary skilled in the art without departing from the spirit and scope of this disclosure and the appended claims.

What is claimed is:

1. A method of forming an isolation film of a semiconductor device, comprising:
    forming a patterned pad film comprising a pad nitride film on a semiconductor substrate;
    forming a trench through the patterned pad film defining an inactive region and an active region;
    forming a liner film on the resulting structure;
    forming an insulating film in the trench;
    stripping the liner film disposed outside of the trench and on top of the patterned pad film leaving liner film disposed inside the trench and in sidewalls of the pad film intact;
    forming a sacrificial film on the resulting structure; and
    performing a dry etch process on the resulting structure until the semiconductor substrate of the active region is exposed, thereby forming the isolation film having an upper surface that is coplanar with the semiconductor substrate of the active region, comprising performing the dry etch process using a gas having a high selectivity ratio between the sacrificial film and the insulating film for trench burial.

2. The method as claimed in claim 1, further comprising forming a wall oxide film on sidewalls of the trench after the trench is formed and before the liner film is formed.

3. The method as claimed in claim 1, wherein the liner film comprises a nitride liner film.

4. The method as claimed in claim 1, wherein the forming the insulating film within the trench comprises forming the insulating film on the resulting structure on which the liner film is formed, and then performing a polishing process until the pad film is exposed.

5. The method as claimed in claim 1, wherein the stripping of the liner film disposed outside of the trench and on top of the patterned pad film further comprises stripping the liner film formed on sidewalls of the trench to a predetermined depth while stripping the pad film to form moats at an interface between the inactive region and the active region.

6. The method as claimed in claim 5, wherein the sacrificial film fills the moats formed at the interface between the inactive region and the active region.

7. The method as claimed in claim 1, wherein the sacrificial film is a sacrificial oxide film that is formed by a deposition method selected from the group consisting of chemical vapor deposition (CVD) and physical vapor deposition (PVD), or is a growth process in an oxygen atmosphere.

8. The method as claimed in claim 1, wherein the sacrificial film comprises a sacrificial oxide film formed by a dry oxidization process or a wet oxidization process using $H_2$ and $O_2$ gas at a pressure of about 10 Torr to about 100 Torr for about 3 hours to about 5 hours.

9. The method as claimed in claim 1, wherein the dry etch process is performed using a mixed gas of $CH_3$ gas and $CF_4$ gas at high bias power of 200 W.

* * * * *